United States Patent
Sun et al.

(10) Patent No.: US 10,785,889 B2
(45) Date of Patent: Sep. 22, 2020

(54) FAN WIRE TRIMMING MODULE

(71) Applicant: ASIA VITAL COMPONENTS CO., LTD., New Taipei (TW)

(72) Inventors: Sung-Wei Sun, New Taipei (TW); Hai-Yang Xiong, New Taipei (TW); Sixi Dong, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 125 days.

(21) Appl. No.: 16/134,925

(22) Filed: Sep. 18, 2018

(65) Prior Publication Data

US 2020/0093029 A1 Mar. 19, 2020

(51) Int. Cl.
*H05K 7/20* (2006.01)
*H02G 1/00* (2006.01)
(Continued)

(52) U.S. Cl.
CPC ........... *H05K 7/20172* (2013.01); *B23Q 3/06* (2013.01); *B23Q 3/18* (2013.01); *F04D 25/0693* (2013.01);
(Continued)

(58) Field of Classification Search
CPC .......... B23Q 3/00; B23Q 3/002; B23Q 3/005; B23Q 3/062; B23Q 3/18; B23Q 3/186; B23Q 3703/00; B23Q 2703/02; B23Q 2703/10; H05K 7/20172; H05K 7/20863; H05K 13/00; H05K 13/0069;
(Continued)

(56) References Cited

U.S. PATENT DOCUMENTS 9,074,603 B2 * 7/2015 Wu ........................ F04D 17/16
9,121,414 B2 * 9/2015 Lofy ................... F04D 25/0693
(Continued)

FOREIGN PATENT DOCUMENTS

CN 207373584 U 5/2018
CN 108233559 A 6/2018
(Continued)

OTHER PUBLICATIONS

Clarence W De Silva, Mechatronics: an integrated approach, 2004, section 9.1.1, pp. 763-765 (Year: 2004).*

*Primary Examiner* — Orlando E Aviles
*Assistant Examiner* — Robert F Neibaur
(74) *Attorney, Agent, or Firm* — Thomas J. Nikolai; DeWitt LLP

(57) ABSTRACT

A fan wire trimming module includes a lower moldboard, an upper moldboard and a base plate. One side of the lower moldboard is formed with a depression and multiple locating bosses. One side of the upper moldboard is formed with multiple locating holes. A periphery of the upper moldboard is formed with at least one fixing split. The locating bosses are fitted in the locating holes. A fixing member is assembled in the fixing split. The upper moldboard is formed with a stator receiving space and at least one hollow section. An inner circumference of the stator receiving space is formed with at least one rib. The hollow section is formed around the stator receiving space. A stator assembly is received in the stator receiving space. Multiple windings are wound on the stator assembly. One end of each winding is engaged in the fixing split.

13 Claims, 5 Drawing Sheets

(51) Int. Cl.
*F04D 25/06* (2006.01)
*B23Q 3/18* (2006.01)
*B23Q 3/06* (2006.01)

(52) U.S. Cl.
CPC ......... *H02G 1/005* (2013.01); *B23Q 2703/02* (2013.01); *B23Q 2703/10* (2013.01)

(58) Field of Classification Search
CPC . H05K 13/0473; F04D 25/0693; F04D 25/08; H02G 1/005; B23P 19/04; B23P 21/00; B23P 2700/50; B25B 11/02; B25B 11/00; Y10T 29/53974
USPC ................. 29/281.4, 739, 741; 269/900, 901
See application file for complete search history.

(56) References Cited

U.S. PATENT DOCUMENTS

| | | | | |
|---|---|---|---|---|
| 9,655,278 | B2* | 5/2017 | Wu | .................... H05K 7/20172 |
| 10,619,642 | B2* | 4/2020 | Horng | ................. F04D 25/0693 |
| 10,639,757 | B2* | 5/2020 | Marburger | ............. B23Q 3/186 |
| 10,655,645 | B2* | 5/2020 | Cooper | ............. H05K 7/20172 |
| 2013/0064700 | A1 | 3/2013 | Wu | |
| 2017/0133915 | A1 | 5/2017 | Jin et al. | |
| 2019/0317577 | A1* | 10/2019 | Lin | ..................... G02B 6/0068 |

FOREIGN PATENT DOCUMENTS

| | | |
|---|---|---|
| CN | 208707485 U | 4/2019 |
| JP | 2003-244908 A | 8/2003 |
| JP | 2003-259614 A | 9/2003 |
| JP | 2010-246220 A | 10/2010 |

* cited by examiner

FAN WIRE TRIMMING MODULE

BACKGROUND OF THE INVENTION

1. Field of the Invention

The present invention relates generally to a fan wire trimming module, and more particularly to a fan wire trimming module, which can greatly enhance the production efficiency and automate the production of thinner fans.

2. Description of the Related Art

Currently, there is a trend to make electronic products less bulky. Therefore, the fan disposed in various electronic products for driving airflow to dissipate the heat must therefore be thinner than the conventional fans currently in production. It has become a critical issue how to design and mass-produce thinned fans, having high power and better structural strength and that is equipped with a motor stator with a thinned structure.

In the manufacturing process of the stator of the existing thinned fans, after the windings are wound on the stator, there is no securing structure for fixing one end of the windings. Therefore, it is necessary to manually trim the wires so as to complete the successive relevant steps. As a result, in the step of soldering the windings, the windings are apt to displace and loosen. This leads to the shortcoming of poor production efficiency and is unbeneficial to automation of production.

It is therefore the applicant's intention to provide a fan wire trimming module, which can solve the above problems and address the shortcomings of the conventional fan.

SUMMARY OF THE INVENTION

It is therefore a primary object of the present invention to provide a fan wire trimming module, which can greatly enhance the production efficiency.

It is a further object of the present invention to provide the above fan wire trimming module, which can fulfill the requirement of automation of production.

To achieve the above and other objects, the fan wire trimming module of the present invention includes a lower moldboard, an upper moldboard and a base plate. One side of the lower moldboard is formed with a depression and multiple locating bosses. One side of the upper moldboard is formed with multiple locating holes. A periphery of the upper moldboard is formed with at least one fixing split. The locating bosses of the lower moldboard are fitted in the locating holes on the upper moldboard. A fixing member is assembled in the fixing split. The upper moldboard is formed with a stator receiving space and at least one hollow section. An inner circumference of the stator receiving space is formed with at least one rib. The hollow section is formed around the stator receiving space. The base plate is disposed in the depression. A bearing cup protrudes upward from one face of the base plate. A circuit board and a stator assembly are fitted on the bearing cup. The stator assembly is received in the stator receiving space. Multiple windings are wound on the stator assembly. One end of each winding is engaged in the fixing split.

The stator assembly is composed of multiple silicon steel sheets having poles protruding outward from the silicon steel sheets. The windings are wound around the poles. Each two adjacent poles define therebetween a receiving space in which the ribs of the stator are disposed.

According to the structural design of the present invention and as indicated above, the ribs of the stator receiving space are correspondingly received in the receiving spaces defined between the poles of the stator assembly. By means of the structures of the ribs, the radial angle of the stator assembly is fixed, whereby the stator assembly cannot be moved left and right. Moreover, by means of at least one soldering point formed on the circuit board, after one end of the winding of the stator assembly correspondingly passes through the soldering point, the end of the winding is engaged in the fixing split of the upper moldboard. Then, by means of the fixing member of the fixing split, the end of the winding is pulled and tensioned and securely engaged in the fixing split. Finally, the locating bosses of the lower moldboard are correspondingly fitted in the locating holes of the upper moldboard to secure the upper moldboard. Accordingly, by means of the structures of the upper and lower moldboards, the shortcoming of the conventional fan that the wire must be trimmed by labor so that the production efficiency is low can be eliminated. In this case, the production efficiency can be greatly enhanced. In addition, through the hollow section of the upper moldboard, the soldering point of the circuit board on the base plate is exposed to outer side. Therefore, the space necessary for the operation (such as tin tipping, insulation and wire soldering) in the manufacturing process of the stator assembly is reserved. Under such circumstance, the production of the stator assembly can be automated.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
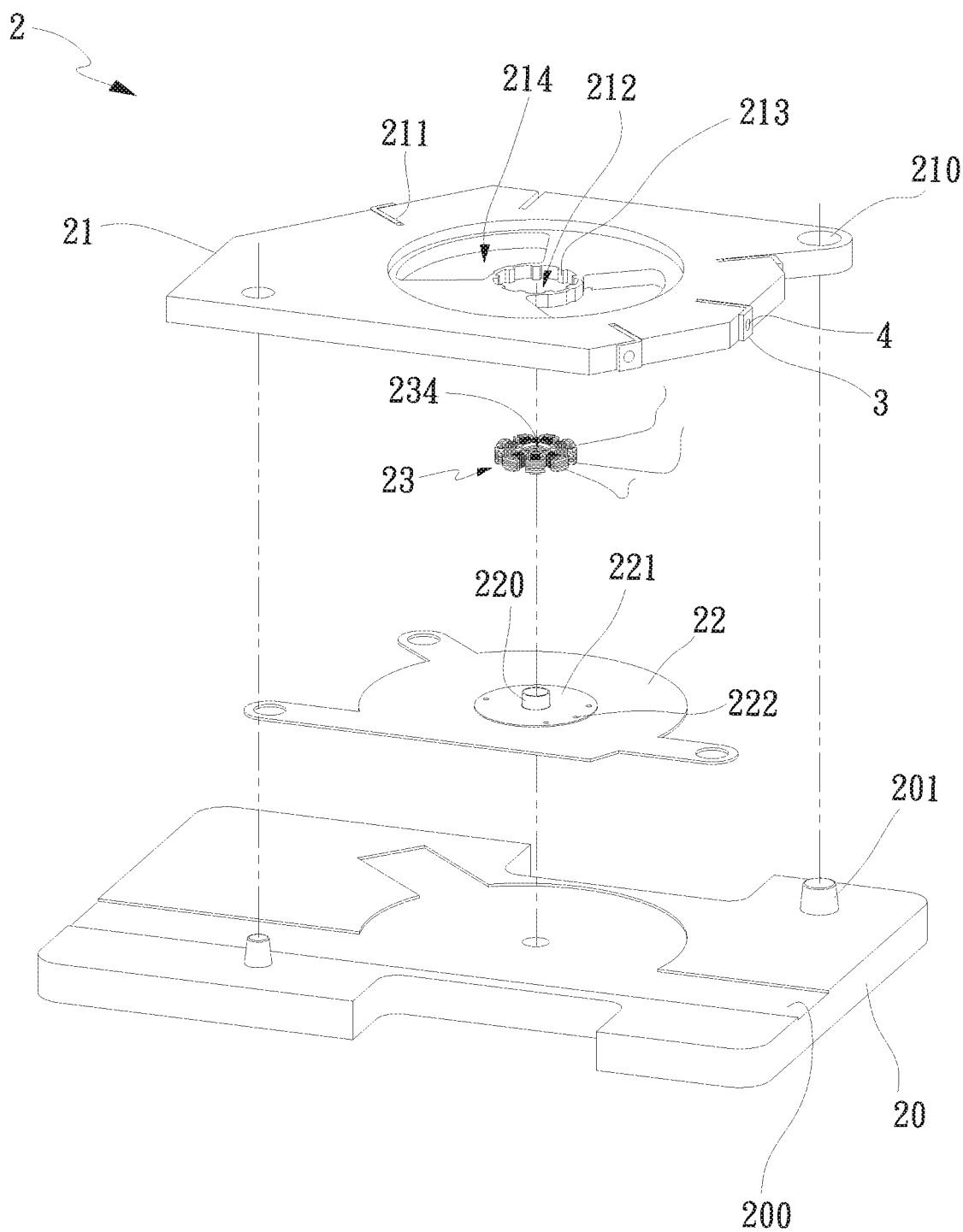
FIG. 1 is a perspective exploded view of a preferred embodiment of the fan wire trimming module of the present invention.
Figure 2:
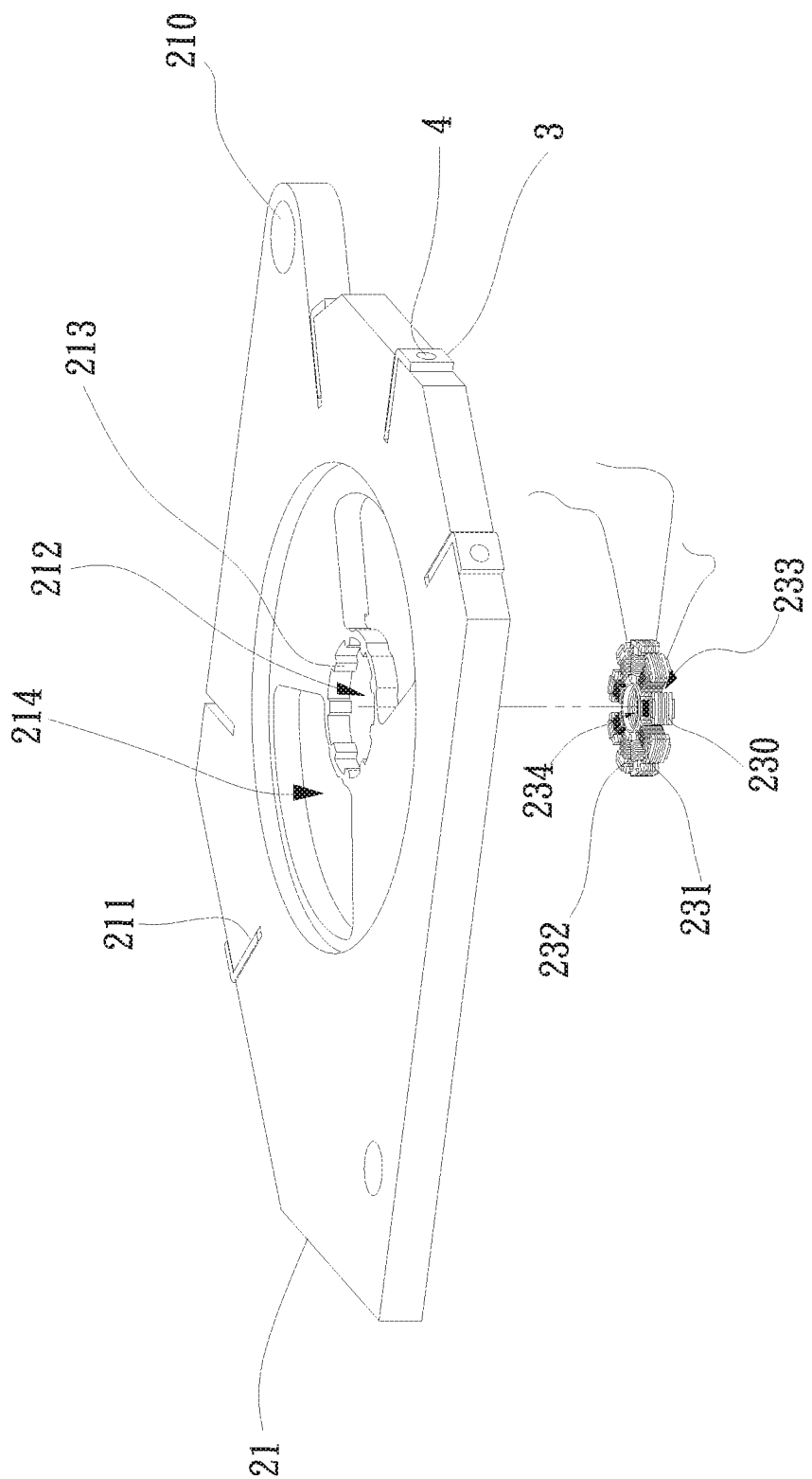
FIG. 2 is an enlarged view of the upper moldboard and the stator of the preferred embodiment of the fan wire trimming module of the present invention.
Figure 3:
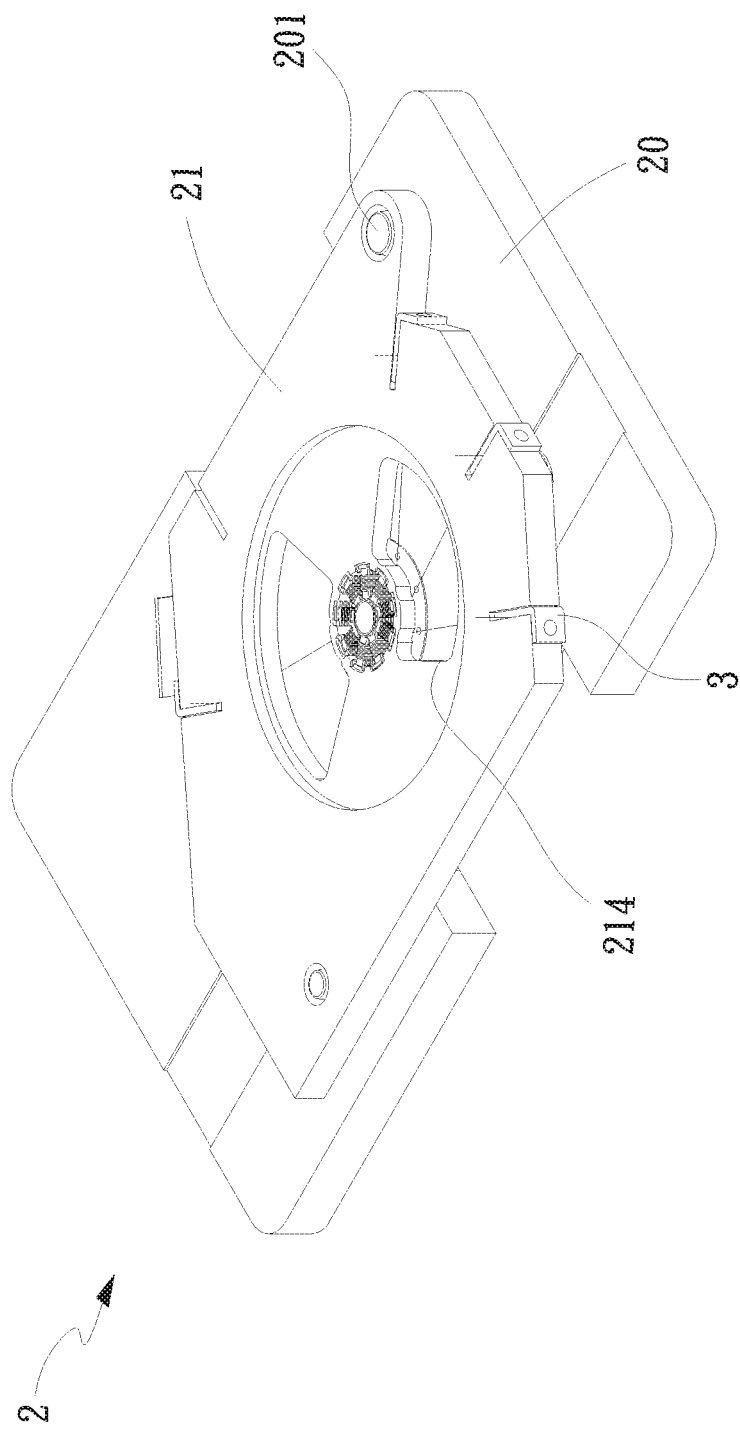
FIG. 3 is a perspective assembled view of the preferred embodiment of the fan wire trimming module of the present invention.
Figure 4:
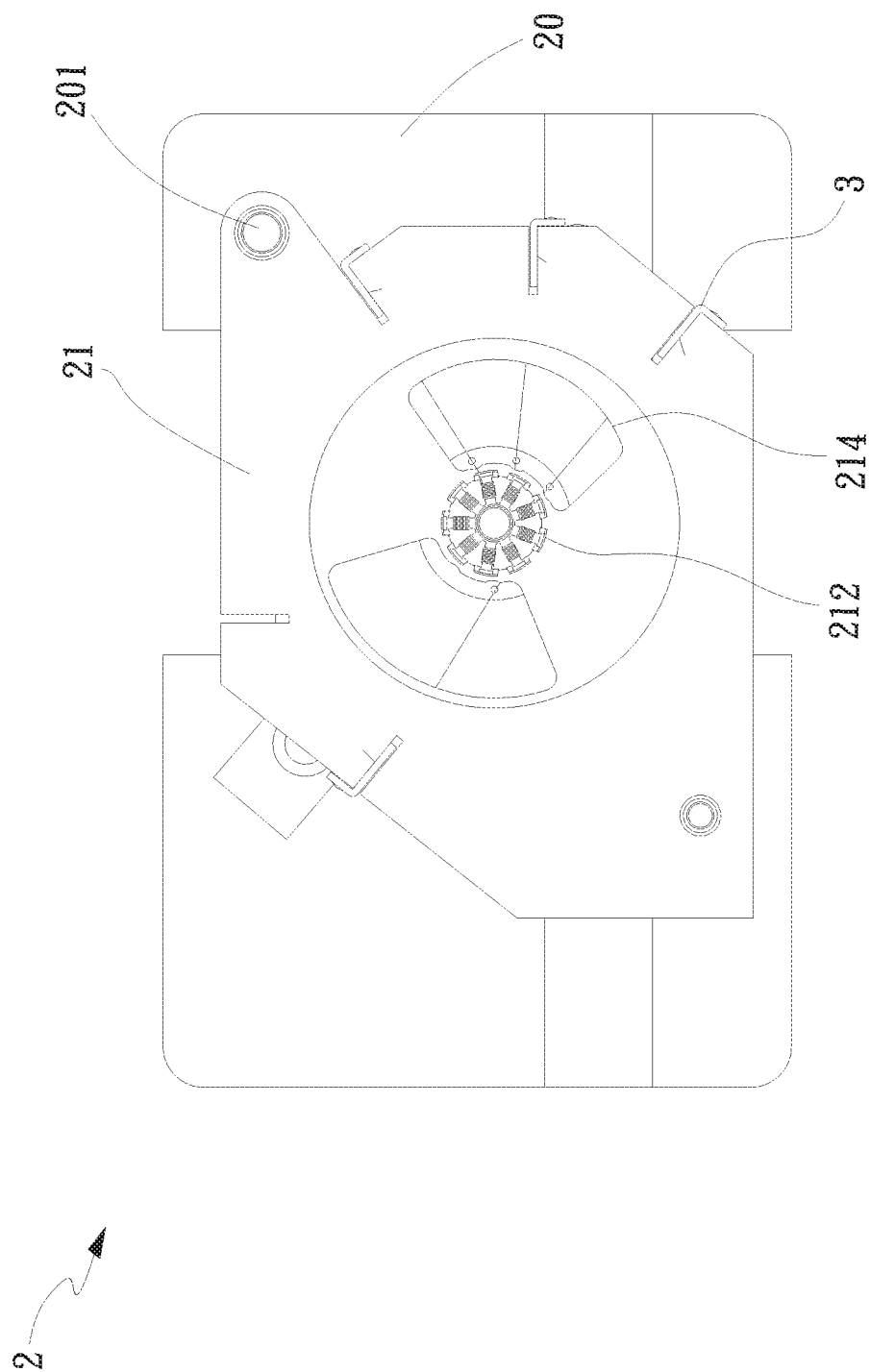
FIG. 4 is a top view of the preferred embodiment of the fan wire trimming module of the present invention.
Figure 5:
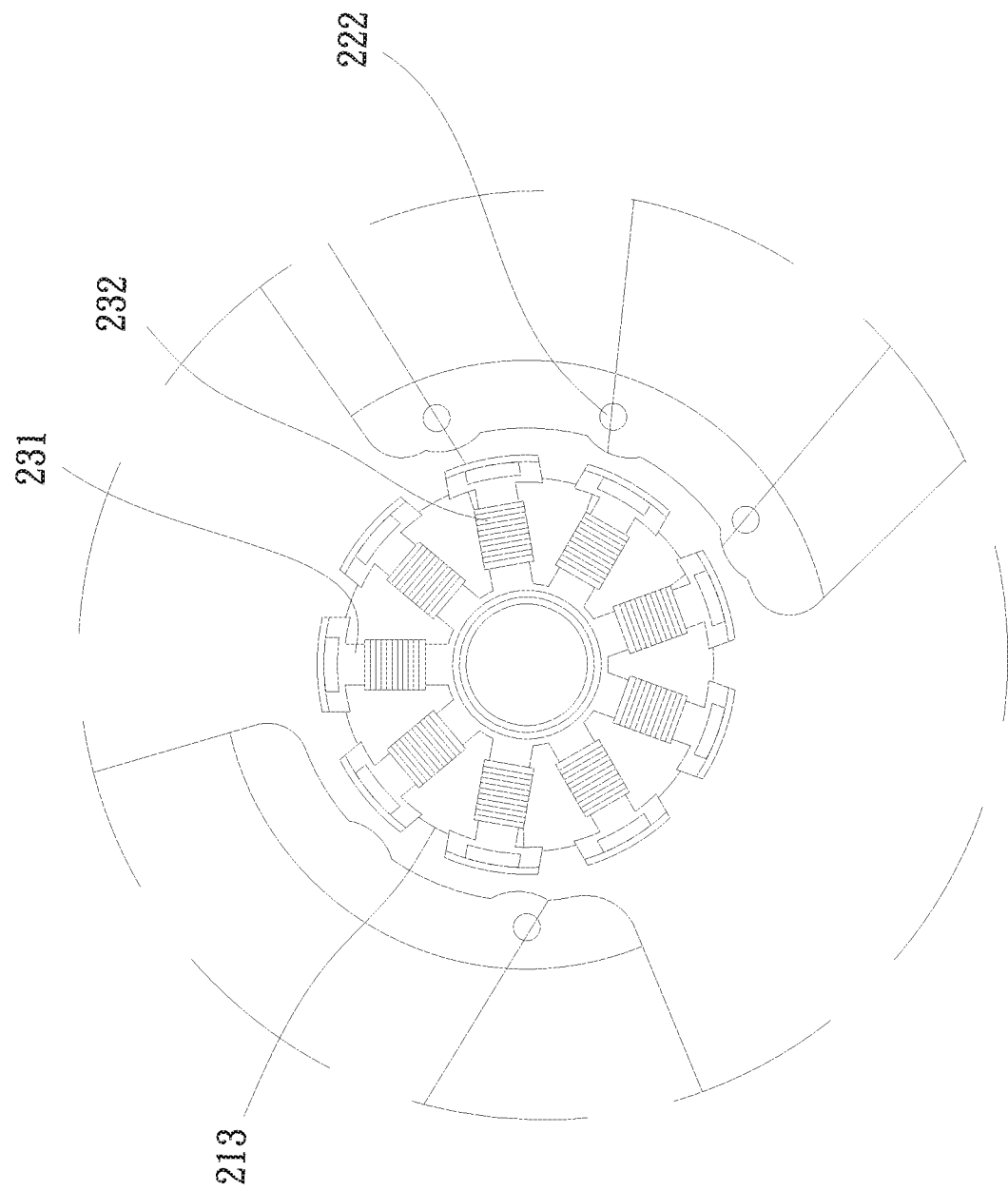
FIG. 5 is an enlarged view of the preferred embodiment of the fan wire trimming module of the present invention.

As shown in the drawings, the fan wire trimming module 2 of the present invention includes a lower moldboard 20, an upper moldboard 21 and a base plate 22. One side of the lower moldboard 20 is formed with a depression 200 and multiple locating bosses 201. The locating bosses 201 are disposed on a section of the lower moldboard 20 outside the depression 200.

One side of the upper moldboard 21 is formed with multiple locating holes 210. In addition, a periphery of the upper moldboard 21 is formed with at least one fixing split 211. The locating bosses 201 are adapted to correspondingly fit in the locating holes 210. A fixing member 3 is correspondingly assembled in the fixing split 211. The fixing member 3 is securely mounted in the fixing split 211 by means of a locking member 4. The fixing member 3 can be a leaf spring or an elastic member with elasticity. A center of the upper moldboard 21 is formed with a stator receiving space 212 and at least one hollow section 214. An inner circumference of the stator receiving space 212 is formed with at least one rib 213. It should be noted that the ribs 213 can be selectively arranged on the inner circumference of the stator receiving space 212 at equal intervals or unequal intervals. The hollow section 214 is correspondingly formed around the stator receiving space 212.

The base plate 22 is correspondingly disposed in the depression 200 of the lower moldboard 20 in flush relation with the face of the lower moldboard 20. A bearing cup 220 protrudes upward from one face of the base plate 22. A circuit board 221 is correspondingly fitted on the bearing cup 220. At least one soldering point 222 is formed on the circuit board 221. The soldering point 222 extends outward from the hollow section 214. A stator assembly 23 is correspondingly disposed on the circuit board 221. The stator assembly 23 has a shaft hole 234 passing therethrough between two ends thereof. By means of the shaft hole 234, the stator assembly 23 is correspondingly fitted on the bearing cup 220. The stator assembly 23 is composed of multiple silicon steel sheets 230. Multiple poles 231 protrude outward from the silicon steel sheets 230. Multiple separate windings 232 are wound around the several poles 231. Each two adjacent poles 231 define therebetween a rib receiving space 233. The stator assembly 23 is correspondingly received in the stator receiving space 212 with the ribs 213 of the stator receiving space 212 correspondingly received in the rib receiving spaces 233. One end of the winding 232 correspondingly passes through the soldering point 222 and then is engaged in the fixing split 211.

According to the structural design of the present invention, the ribs 213 of the stator receiving space 212 are correspondingly received in the rib receiving spaces 233 defined between the poles 231 of the stator assembly 23. By means of the structures of the ribs 213, the radial angle of the stator assembly 23 is fixed, whereby the stator assembly 23 cannot be moved left and right. Moreover, by means of the soldering point 222 on the circuit board 22, one end of the winding 232 of the stator assembly 23 is pulled and tensioned. After correspondingly passing through the soldering point 222, the end of the winding 232 is engaged in the fixing split 211 of the upper moldboard 21. Then, by means of the fixing member 3 of the fixing split 211, the tensioned end of the winding 232 is securely engaged in the fixing split 211. Finally, the locating bosses 201 of the lower moldboard 20 are correspondingly fitted in the locating holes 210 of the upper moldboard 21 to secure the upper moldboard 21 and prevent the upper moldboard 21 from freely moving in the manufacturing process of the stator assembly 23. Accordingly, by means of the structures of the upper and lower moldboards 20, 21, the shortcoming of the conventional fan that the wire must be trimmed by labor so that the production efficiency is low can be eliminated. In this case, the production efficiency can be greatly enhanced.

In addition, through the hollow section of the upper moldboard 21, the soldering point 222 of the circuit board 221 on the base plate 22 is exposed to outer side. Therefore, the space necessary for the operation (such as tin tipping, insulation and wire soldering) in the manufacturing process of the stator assembly 23 is reserved. Under such circumstance, the production of the stator assembly can be automated.

In conclusion, in comparison with the conventional fan, the present invention has the following advantages:

1. The production efficiency is greatly enhanced.

2. The production of the stator assembly can be automated.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A fan wire trimming module comprising: a lower moldboard, one side of the lower moldboard being formed with a depression and multiple locating bosses; an upper moldboard, one side of the upper moldboard being formed with multiple locating holes, a periphery of the upper moldboard being formed with at least one fixing split, the locating bosses on the lower moldboard adapted to fit within the locating holes in the upper moldboard, a fixing member being correspondingly assembled in the fixing split, the upper moldboard being formed with a stator receiving space and at least one hollow section, an inner circumference of the stator receiving space being formed with at least one rib, the hollow section being correspondingly formed around the stator receiving space; a base plate correspondingly disposed in the depression, a bearing cup upward protruding from one face of the base plate, a circuit board and a stator assembly being correspondingly supported by the bearing cup, the stator assembly being correspondingly received in the stator receiving space, multiple conductive wire windings being wound on the stator assembly, one end of each wire winding being correspondingly engaged in the fixing split wherein the stator assembly is composed of multiple silicon steel sheets in stacked relation, multiple poles outward protruding from the silicon steel sheets, the wire windings being wound around the poles, the at least one rib being correspondingly received in an at least one rib receiving space, wherein each two adjacent poles define therebetween a rib receiving space of said at least one rib receiving space.

2. The fan wire trimming module as claimed in claim 1, wherein the at least one rib is arranged on the inner circumference of the stator receiving space at equal intervals or unequal intervals.

3. The fan wire trimming module as claimed in claim 1, wherein at least one soldering point is formed on the circuit board, one end of the wire winding correspondingly passing through the soldering point and then being engaged in the fixing split.

4. The fan wire trimming module as claimed in claim 3, wherein the soldering point of the circuit board is correspondingly outward exposed to the hollow section.

5. The fan wire trimming module as claimed in claim 1, wherein the stator assembly further has a shaft hole passing through the stator assembly between two ends thereof, the bearing cup being correspondingly inserted through the shaft hole.

6. The fan wire trimming module as claimed in claim 1, wherein the base plate is correspondingly disposed in the depression in flush with one face of the lower moldboard.

7. The fan wire trimming module as claimed in claim 1, wherein the fixing member is a leaf spring or an elastic member.

8. A fan wire trimming module comprising:
a lower moldboard, one side of the lower moldboard being formed with a depression and multiple locating bosses;
an upper moldboard, one side of the upper moldboard being formed with multiple locating holes, a periphery of the upper moldboard being formed with at least one fixing split, the locating bosses on the lower moldboard outside of the depression adapted to fit within the locating holes in the upper moldboard, a fixing member being correspondingly assembled in the fixing split, the upper moldboard being formed with a stator receiving space and at least one hollow section, an inner circumference of the stator receiving space being formed with at least one rib, the hollow section being correspondingly formed around the stator receiving space; and a base plate correspondingly disposed in the depression, a bearing cup upward protruding from one face of the base plate, a circuit board and a stator assembly being correspondingly supported by the bearing cup, the stator assembly being correspondingly received in the stator receiving space, multiple conductive wire windings being wound on the stator assembly, one end of each wire winding being correspondingly engaged in the fixing split.

9. The fan wire trimming module as claimed in claim 8, wherein the at least one rib is arranged on the inner circumference of the stator receiving space at equal intervals or unequal intervals.

10. The fan wire trimming module as claimed in claim 8, wherein at least one soldering point is formed on the circuit board, one end of the wire winding correspondingly passing through the soldering point and then being engaged in the fixing split.

11. The fan wire trimming module as claimed in claim 10, wherein the soldering point of the circuit board is correspondingly outward exposed to the hollow section.

12. The fan wire trimming module as claimed in claim 8, wherein the stator assembly further has a shaft hole passing through the stator assembly between two ends thereof, the bearing cup being correspondingly inserted through the shaft hole.

13. The fan wire trimming module as claimed in claim 8, wherein the base plate is correspondingly disposed in the depression in flush with one face of the lower moldboard.

\* \* \* \* \*